US008524605B1

(12) United States Patent  (10) Patent No.: US 8,524,605 B1
Chen  (45) Date of Patent: Sep. 3, 2013

(54) FABRICATION AND MASK DESIGN METHODS USING SPATIAL FREQUENCY SEXTUPLING TECHNIQUE

(75) Inventor: Yijian Chen, Hercules, CA (US)

(73) Assignee: Vigma Nanoelectronics, Hercules, CA (US)

( * ) Notice: Subject to any disclaimer, the term of this patent is extended or adjusted under 35 U.S.C. 154(b) by 0 days.

(21) Appl. No.: 13/506,371

(22) Filed: Apr. 16, 2012

(51) Int. Cl.
*H01L 21/331* (2006.01)

(52) U.S. Cl.
USPC ............. 438/696; 438/703; 257/E21.249

(58) Field of Classification Search
USPC .................. 438/696, 703; 257/E21.249
See application file for complete search history.

(56) References Cited

U.S. PATENT DOCUMENTS

| 7,611,980 | B2 * | 11/2009 | Wells et al. | 438/597 |
| 2006/0281266 | A1 * | 12/2006 | Wells | 438/299 |
| 2011/0006402 | A1 * | 1/2011 | Zhou | 257/618 |
| 2013/0065397 | A1 * | 3/2013 | Chen | 438/703 |

* cited by examiner

*Primary Examiner* — Truong Q Dang

(57) ABSTRACT

Self-aligned sextuple patterning (SASP) processes and mask design methods for the semiconductor manufacturing are invented. The inventions pertain to methods of forming one and/or two dimensional features on a substrate having the feature density increased to six times of what is possible using the standard optical lithographic technique; and methods to release the overlay requirement when patterning the critical layers of semiconductor devices. Our inventions provide production-worthy methods for the semiconductor industry to continue device scaling beyond 15 nm (half pitch).

11 Claims, 7 Drawing Sheets

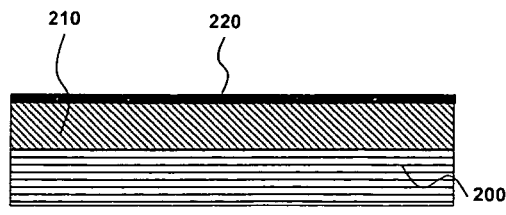
Fig. 2A
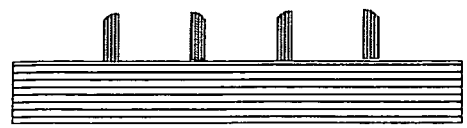
Fig. 2E
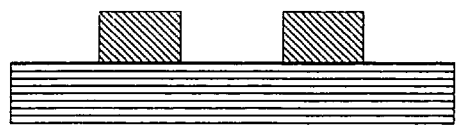
Fig. 2B
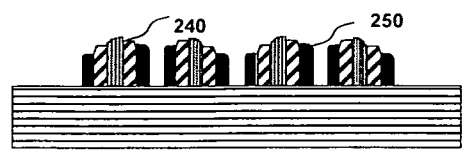
Fig. 2F
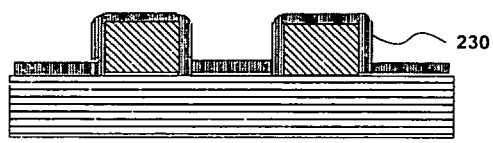
Fig. 2C
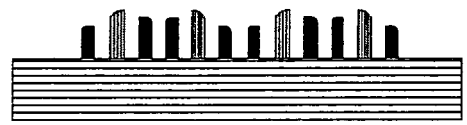
Fig. 2G
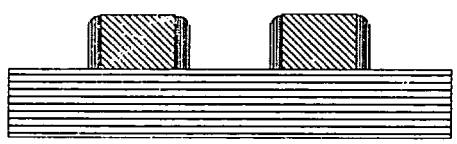
Fig. 2D
Fig. 2H
Fig. 2

FABRICATION AND MASK DESIGN METHODS USING SPATIAL FREQUENCY SEXTUPLING TECHNIQUE

BACKGROUND OF THE INVENTION

Optical ArF (wavelength: 193 nm) DUV immersion lithography with NA=1.35 can print half-pitch features as small as 38 nm. The next-generation EUV lithography (EUVL) technology has been delayed for several times due to its limitations in power source, throughput, resist line edge roughness (LER) and mask defect issues [1]. Therefore, a paradigm shift in patterning technology, from mainly relying on scanners' optical resolution capability to adopting spacer based frequency multiplication techniques, has occurred in the semiconductor industry to continue IC scaling.

Spacer based self-aligned multiple patterning techniques [2-4] such as double (SADP), triple (SATP), quadruple (SAQP) schemes, when combined with ArF DUV immersion lithgraphy, can potentially drive the resolution of IC features down to about 10 nm (half pitch). By designing various mandrel patterns which further define the route of the spacers formed on their sidewall, some multiple patterning techniques are more capable of driving up the feature density, while others are favorable to reducing process complexity with less masks and allowing more 2-D design flexibility. For example, the self-aligned double patterning (SADP) process has been used in NAND flash manufacturing from 35 nm to 19 nm node (half pitch); and gradually extended to logic micro-processor patterning recently [2]. Other more aggressive frequency multiplication techniques such as self-aligned triple (SATP, [3]) and quadruple (SAQP, [4]) processes have also been developed recently. It was demonstrated that by adding only one extra CVD/spacer step, the SATP process gains 50% improvement in density compared with a SADP process, and allows complex 2-D layout using less masks than SAQP process. For sub-10 nm patterning capability, the semiconductor industry has not found a cost-effective solution except turning to expensive EUVL which however will not be ready for high-volume manufacturing in time.

To overcome the scaling barriers towards sub-10 nm (half-pitch) nodes, a self-aligned frequency sextupling (or self-aligned sextupling patterning, referred to herein as "SASP" process) technique is invented. The SASP process based mask design method to release the overlay requirement for memory (e.g., NAND flash and DRAM) manufacturing is also invented. It provides a production-worthy method for the semiconductor industry to continue device scaling beyond the 10 nm in a timely manner with no need of EUVL technology.

BRIEF SUMMARY OF THE INVENTION

Embodiments of the present invention pertain to methods of forming patterned features on a substrate using specific mask layouts, having a pitch reduced to one sixth of the original value defined by the minimum resolution of a lithographic tool. Based on standard semiconductor processing techniques and the invented mask design method, a 4-mask process module is developed to pattern complicated 2-D patterns and to release the overlay requirements for patterning critical layers of memory (NAND flash and DRAM) devices. Further applications of the present disclosure will become apparent from the detailed description provided hereinafter.

A number of novel self-aligned sextuple patterning (SASP) process sequences are developed in accordance with the invention. In one such process, a sacrificial layer such as amorphous carbon film is formed over the substrate and patterned to create the carbon mandrels. After that, oxide or nitride spacers (referred to as spacer A) are formed on the sidewalls of carbon mandrels by depositing an oxide or nitride layer and etching it back to just remove the deposited material on the top surface of the carbon mandrels. The (sacrificial) carbon mandrels are then etched by oxygen plasma which does not attack the oxide or nitride spacers. The left oxide or nitride spacers are used as the second mandrels for two consecutive spacer processes to follow. Many material choices for these two consecutive spacers (referred to as spacer B and C) are possible, provided that they have high etching selectivity to each other. For example, if oxide is chosen as the second mandrels, polycrystalline or amorphous Si can be used for spacer B, and nitride or oxide for spacer C. Spacer B must be wet or dry etched later by a highly selective etch process which does not attack the second mandrels and spacer C, resulting in spatial frequency sextupling.

In a semiconductor process, each critical layer needs to contain both dense arrays (e.g., lines/spaces and pads) and less dense peripheral patterns to perform designed circuit functions. For example, in NAND flash manufacturing wherein the self-aligned double patterning (SADP) process has been widely used, normally the dense arrays and peripheral circuits (including final pads) are decomposed into separate masks and totally 3 masks (core mask, cut mask, and pad/peripheral mask) are needed for one critical layer [2]. Unfortunately, the SADP mask design methodology does not work for a SASP process as it will result in a small gap between the second mandrels and spacer C. Such a small gap will create severe difficulty in meeting the overlay requirement of the final pad layer as an alignment inaccuracy can easily cause the final pads connected to wrong lines. To release the overlay requirement of a SASP process, a new method to design mask layout must be invented. As shown in FIG. 5D, an extra mask (totally 4 masks) is needed in a SASP process to add assisting rectangles on top of spacers A for spacers B to branch out such that the overlay requirement of final pads (attached to the ends of spacers for contact landing) can be relaxed.

In the other process, minor modification is made to replace the amorphous carbon (first mandrel material in the former process) with a patterned resist and to use the second mandrel (spacer A) as a hard mask to transfer the spacer pattern to the layer underneath to avoid the problem of asymmetric spacer profile. After the pattern transfer is done (with a dry etch), spacers B and C are formed on the sidewall of the transferred pattern, rather than directly on the second mandrel (spacer A). This modified process requires more steps, but it produces an improved structural profile and results in better CD uniformity.

It should be pointed out that the detailed description and specific examples/materials, while indicating various embodiments, are intended for purposes of illustration only and are not intended to limit the scope of the disclosure.

BRIEF DESCRIPTION OF THE SEVERAL VIEWS OF THE DRAWING(S)

A further understanding of the nature and advantages of the invention may be realized by reference to the specification and the drawings presented below. The Figures are incorporated into the detailed description portion of the invention.

FIG. 2 illustrates the cross-sectional views representing another self-aligned sextupling patterning (SASP) process according to the other embodiment of the invention.

DETAILED DESCRIPTION OF THE INVENTION

Embodiments of the present invention (self-aligned sextuple patterning, SASP) pertain to methods of forming patterned features on a substrate having a pitch reduced to one sixth of what is achievable using standard lithographic techniques. Compared with self-aligned double patterning (SADP) process which has been used in the production of high density 1-D lines/spaces, the SASP technique significantly increases the feature density by using a slightly more complex process. While this technique can form bit lines, wider lines and features (e.g., line-end pads, power supply lines, string select lines in NAND devices, etc.) are usually necessary on same layer to form working devices, which requires multiple masks to be used to pattern one critical layer. Therefore, it is important to research a mask design method that not only allows reasonable (i.e., not too tight) overlay specifications, but also requires the minimum number of masks to reduce the process complexity and costs.

Figure 4:
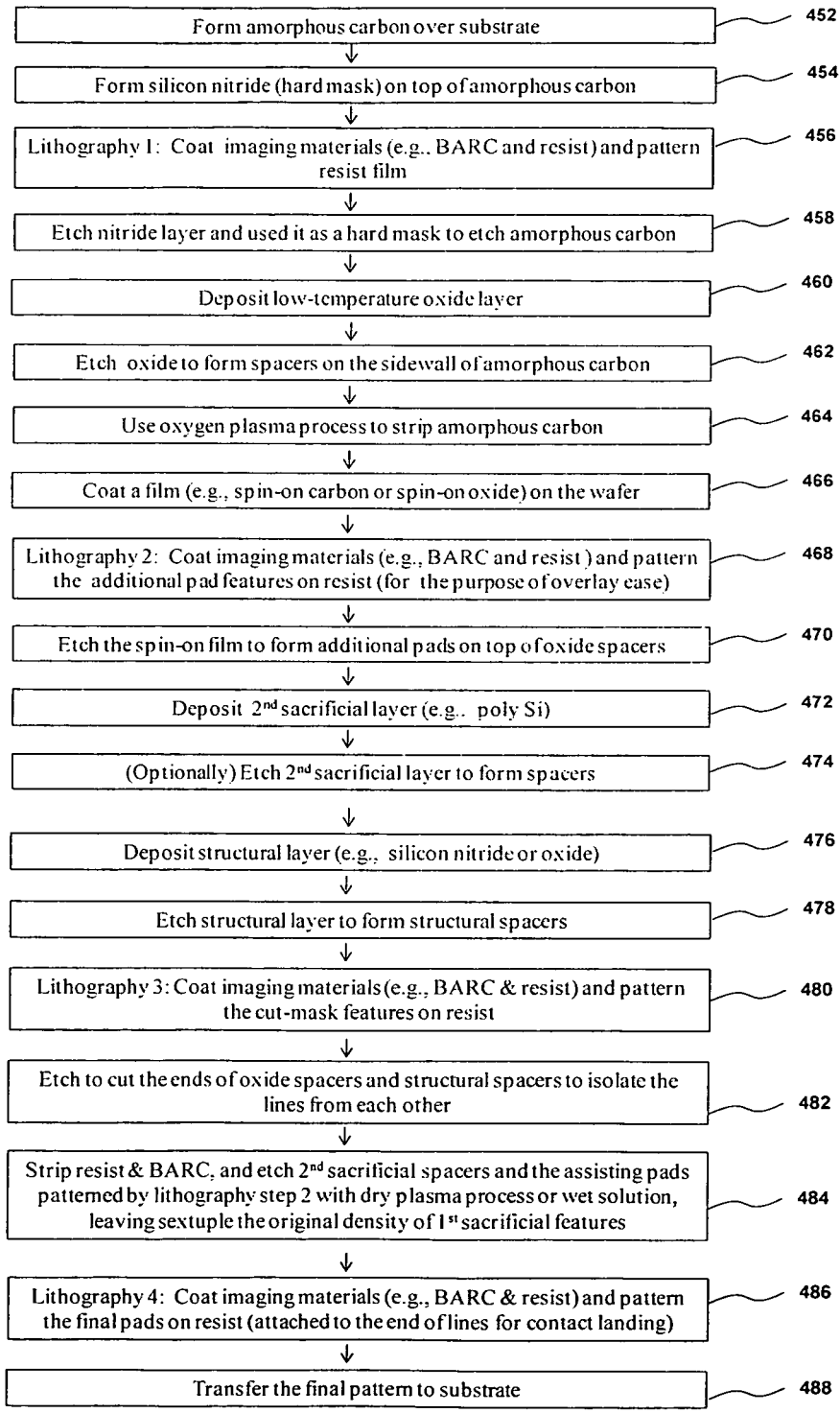
FIG. 4 is a flowchart depicting steps associated with the SASP process described by FIG. 2.
Figures 5A, 5B:
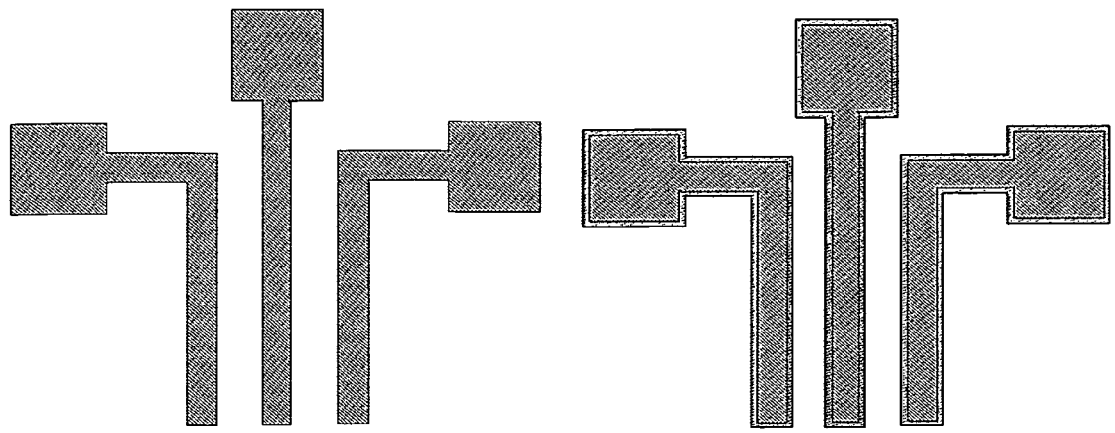
FIG. 5 are top views associated with 4-mask layout designed to release the overlay requirement of a SASP process. Less dense 2-D peripheral features resolvable by single-exposure optical lithography (not shown in the figure) can be patterned together with the final pads using the same mask.
Figures 5C, 5D:
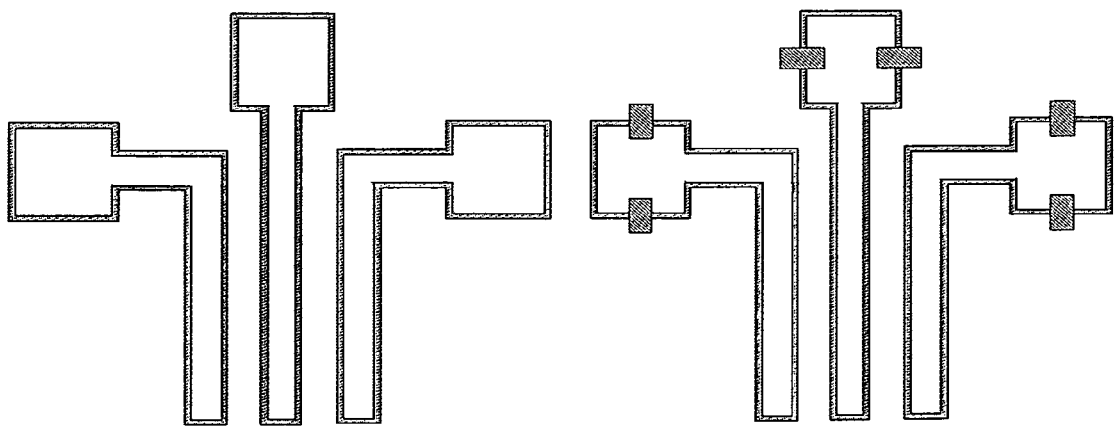

To better understand and appreciate the invention, a flowchart is shown in FIG. 4 to depict the steps associated with a self-aligned sextuple patterning (SASP) process according to one embodiment of the invention. The correspondingly cross-sectional views cutting through the array structure (lines/spaces) is shown FIGS. 2A-H to illustrate the process details in above flowchart. The method starts by forming a stack of layers on a substrate 200 as shown in FIG. 2A, and indicated in operations 452 and 454 as shown in FIG. 4. This stack of layers includes an amorphous carbon layer 210 and a hardmask layer 220 (e.g., silicon nitride). The amorphous carbon layer will be used as an example of the first sacrificial material; however, this sacrificial layer can be other commonly used semiconductor material that can be dry etched by a highly selective plasma process or wet etched by a selective chemical solution. The possible choices of the sacrificial material include (but not limited to): amorphous carbon (normally requiring a nitride hard mask on the top) which can be etched by oxygen plasma, photo-sensitive imaging materials such as a combination of photoresist and BARC (bottom anti-reflective coating, which is usually required before photoresist coating to reduce the standing-wave effect) that can be etched by oxygen plasma, silicon oxide that can be wet etched by HF solution, silicon nitride that can be wet etched by phosphoric acid, or polycrystalline Si (poly-Si) that can be wet etched by KOH solution. In the following description, we shall use amorphous carbon as an example of the sacrificial layer 210. The first sacrificial layer 210 is patterned by the optical lithography (operation 456) and the half pitch of patterned features is defined by the minimum resolution of the lithographic tools (e.g., about 38 nm in ArF DUV immersion lithography). The clear-field mask pattern of lithography 1 is shown in FIG. 5A. For the purpose of drawing convenience, only three lines are drawn in FIG. 5A while the actual number of lines can be arbitrary in semiconductor manufacturing. The formed patterns on resist is transferred to nitride first and then etched into the amorphous carbon underneath (using nitride as a hard mask to etch amorphous carbon), as shown in FIG. 2B and depicted by operation 458. A low-temperature oxide layer 230 is then deposited (operation 460) on top of the amorphous carbon and etched back (operation 462) to form oxide spacers on the sidewalls of amorphous carbon, as shown in the top view of FIG. 5B. The carbon mandrels (the first sacrificial features) are then stripped by an oxygen plasma process (operation 464), resulting in spatial frequency doubling as shown in FIG. 2E and FIG. 5C.

To avoid a tight overlay specification when printing a pad at the end of each line, assisting features (e.g., rectangle patterns) on top of oxide spacers need to be formed such that the following spacers (shown in FIG. 2F and FIGS. 5D-E) can branch out to create large enough distance between them. The corresponding mask design methodology is shown in FIG. 5 to illustrate how to create a large distance between a final pad (attached to the end of each line, see FIG. 5J) and the neighboring lines in order to tolerate certain level of misalignment when patterning the final pad layer. The process starts by coating the wafer with a thin film (e.g., spin-on carbon or spin-on oxide, operation 466), followed by the second lithographic step (clear-field lithography 2, operation 468) and etching step (operation 470) to add assisting rectangle patterns on top of oxide spacers as shown in FIG. 5D.

Figure 5E:
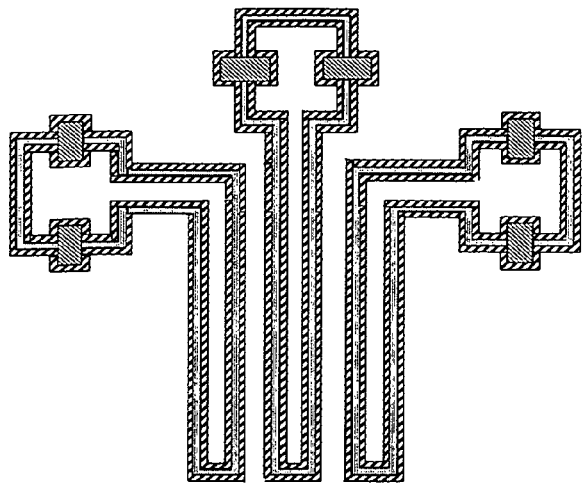
Figure 5F:
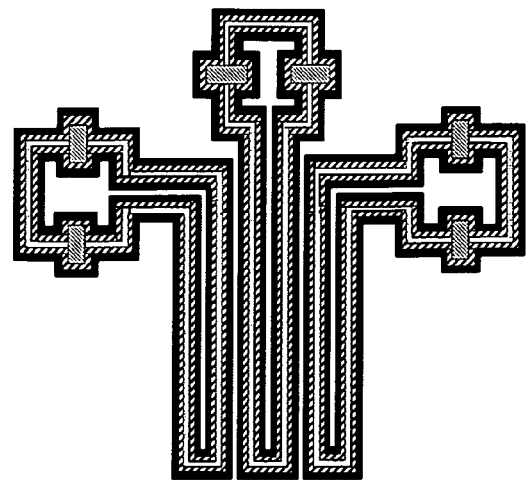
Figure 5G:
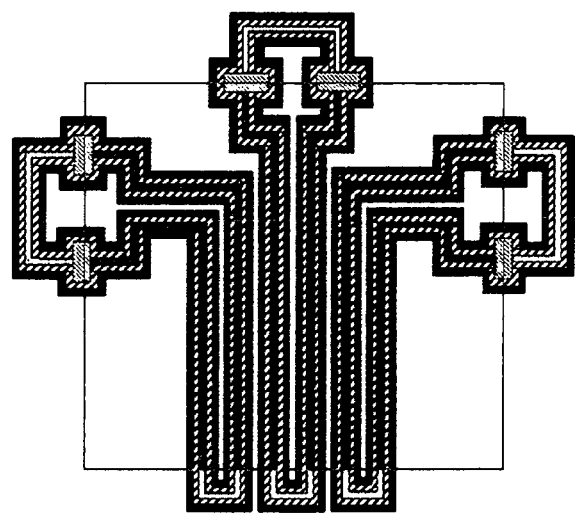
Figure 5H:
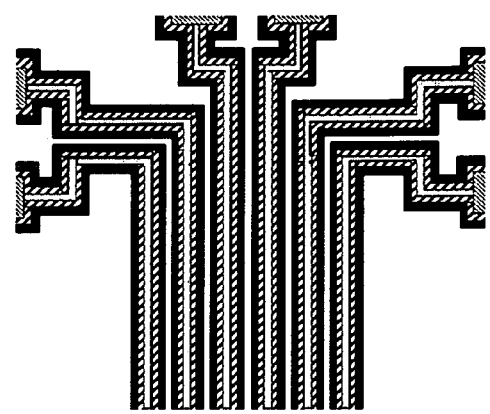
Figure 5I:
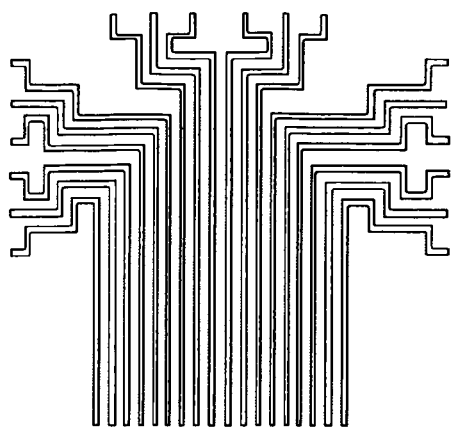
Figure 5J:
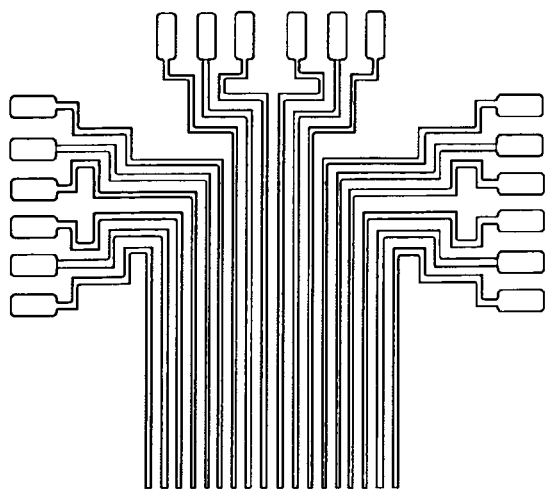

The second spacer (sacrificial spacer, 240) and the third spacers (structural spacer, 250) are formed consecutively as shown in FIG. 2F and FIGS. 5E-F. A cut mask is used to pattern the blocking features (lithography 3, shown in FIG. 5G), followed by an etching process (operation 482, shown in FIG. 5H) to cut the ends of closed-loop oxide spacers and structural spacers. After this etch step is completed, resist & BARC are stripped. The second (sacrificial) spacers and the assisting rectangles patterned by lithography step 2 are then removed with dry plasma process or wet solution (operation 484). As shown in FIG. 2G and FIG. 5I, the resultant line density is six times of the original density of the first sacrificial lines (amorphous carbon). Finally, a lithographic step (lithography 4, operation 486) will print a pad at the end of each line for contact landing, and the pattern of line array with pads may be transferred to the substrate (operation 488).

Figure 1:
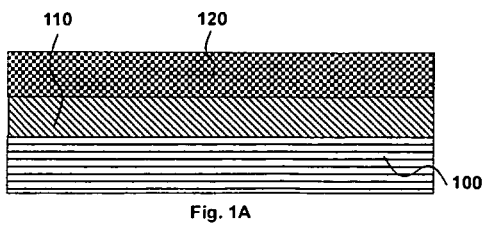
FIG. 1 illustrates the cross-sectional views representing a self-aligned sextupling patterning (SASP) process according to one embodiment of the invention.
Figure 1:
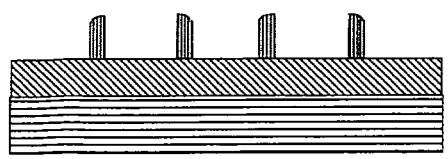
Figure 1:
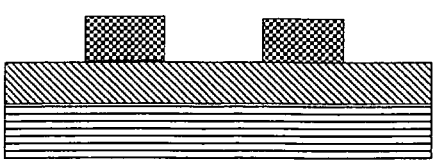
Figure 1:
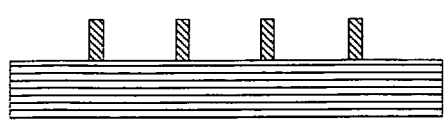
Figure 1:
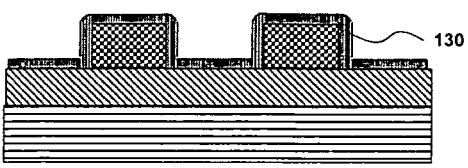
Figure 1:
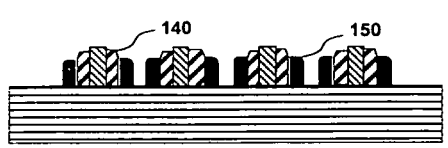
Figure 1:
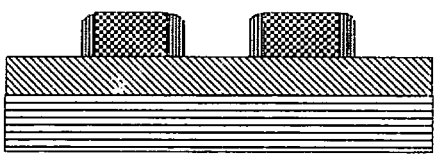
Figure 1:
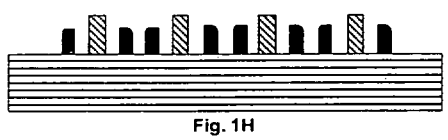
Figure 1:
Figure 3:
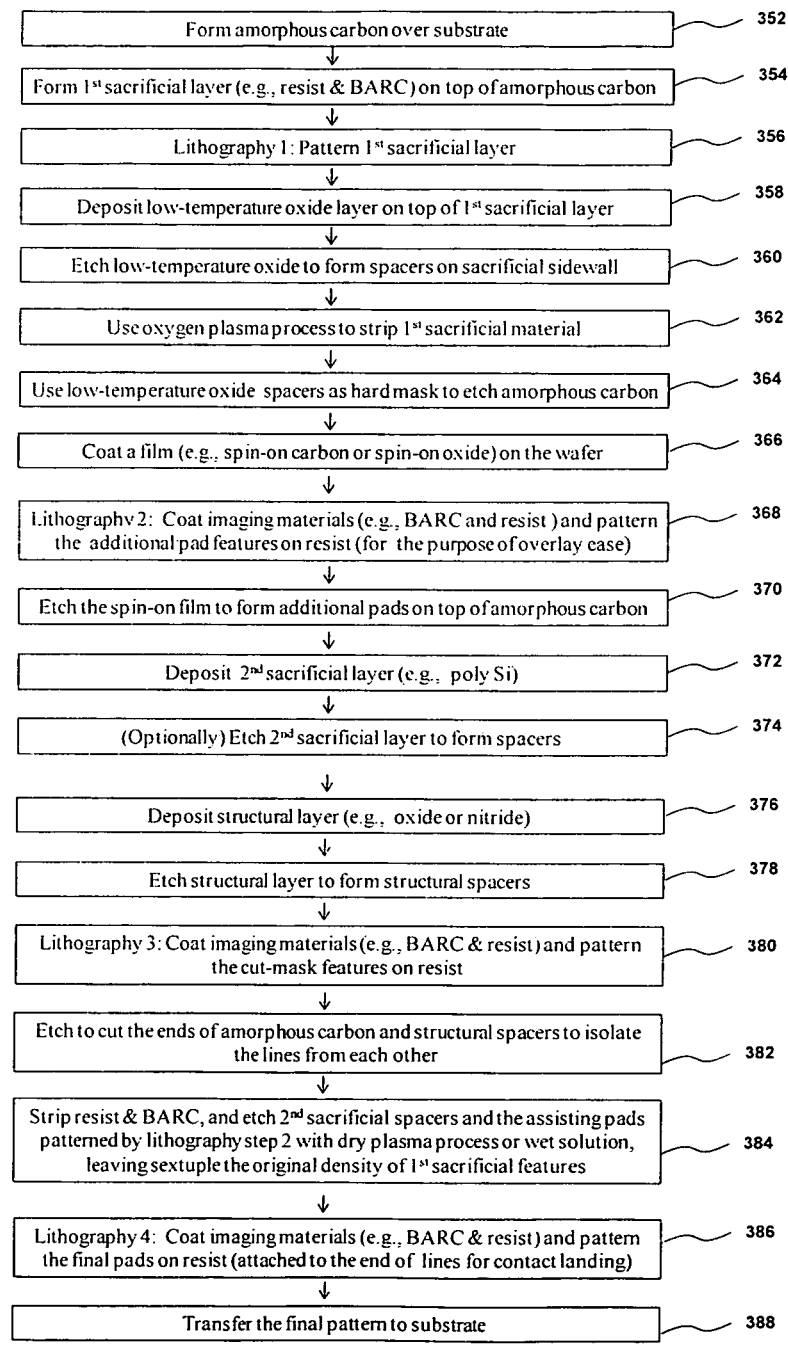
FIG. 3 is a flowchart depicting steps associated with the SASP process described by FIG. 1.

Another flowchart is shown in FIG. 3 to depict the steps associated with a slightly different SASP process. The corresponding cross-sectional views cutting through the array structure (lines/spaces) is shown FIGS. 1A-I to illustrate the process details of the steps in above flowchart. The method starts by forming a stack of layers on a substrate 100 as shown in FIG. 1A, and indicated in operations 352 and 354 as shown in FIG. 3. The stack of layers includes an amorphous carbon layer 110 and a sacrificial layer 120 (the first sacrificial layer). This sacrificial layer can be a commonly used semiconductor material that can be dry etched by a highly selective plasma process or wet etched by a selective chemical solution. In the following description, we shall use photo-sensitive imaging materials (including BARC and resist coatings) as an example of the sacrificial layer 120 as they provide a more cost-effective solution compared with other material choices. The first sacrificial layer 120 is patterned by the optical lithography (operation 356) and the half pitch of patterned features is defined by the minimum resolution of the lithographic tools (e.g., about 38 nm in ArF DUV immersion lithography). A low-temperature CVD (chemical vapor deposition) silicon oxide layer 130 is then deposited (operation 358 as illuminated in FIG. 1C) on top of the patterned photoresist and etched back (operation 360 as illuminated in FIG. 1D) to form oxide spacers on the sidewalls of photoresist. The photoresist mandrels (the first sacrificial features) are then stripped by an oxygen plasma process (operation 362), resulting in spatial frequency doubling as shown in FIG. 1E. The oxide spacers are used as a hard mask to transfer the pattern to the amorphous carbon layer underneath (operation 364 as illuminated in FIG. 1F).

After the second lithography step (operation 368) and an etching process (operation 370) are completed to add assisting rectangles on the top of amorphous carbon, the second sacrificial layer 140 (e.g., poly Si) is then deposited on top of the amorphous carbon (operation 372) and etched back (operation 374) to form poly Si spacers on the sidewalls of amorphous carbon. After that, another structural spacer (e.g., oxide or nitride) is formed by depositing the structural layer 150 (operation 376) and etching it back (operation 378). Finally, the second sacrificial layer 140 is removed by a highly selective plasma process (which does not attack the mandrels 110 and structural spacers 150). The resultant spatial frequency is three times of the oxide spacers formed after the first sacrificial material is stripped. Since the spatial frequency of the oxide spacers is twice of the original frequency of the photoresist features, the spatial frequency of the final lines/spaces formed in the substrate 100 is six times of the frequency of the photoresist features. Many steps of this process are similar to the former process and the details have been disclosed in FIG. 1 and in the flowchart of FIG. 3.

Apparently, the uniqueness of the invention (SASP technique) is first: the design of a process that can combine the SADP (double patterning) and SATP (triple patterning) processes in a simple manner. The resultant process costs slightly increase while its feature density is significantly improved compared with other patterning candidates (e.g., SAQP technique). Secondly, a special mask layout is designed to add assisting rectangles on top of first spacers such that the following spacers can branch out to create large enough space between the ends of lines. This will help to release the overlay requirement when patterning the final pad layer.

REFERENCES

[1] International Technology Roadmap for Semiconductors (ITRS), 2011 version.
[2] C. Bencher, Y. M. Chen, H. Dai, W. Montgomery, L. Huli, "22 nm Half-Pitch Patterning by CVD Spacer Self Alignment Double Patterning (SADP)", *Proc. SPIE* Vol. 6924, 69244E, 2008.
[3] Y. Chen, P. Xu, L. Miao, Y. M. Chen, Xumou Xu, D. Mao, P. Blanco, C. Bencher, R. Hung, C. Ngai, "Self-aligned Triple Patterning for Continuous IC Scaling to Half-Pitch 15 nm," *Proc. of SPIE*, Vol. 7973, 79731P, 2011.
[4] P. Xu, Y. M. Chen, Y. Chen, L. Miao, S. Sun, S-W Kim, A. Berger, D. Mao, C. Bencher, R. Hung, C. Ngai, "Sidman spacer quadruple patterning for 15-nm half-pitch," *Proc. of SPIE*, Vol. 7973, 79731Q, 2011.

The invention claimed is:

1. A self-aligned sextuple patterning process comprising:
a first layer of a first sacrificial material formed over the substrate;
a hard-mask layer formed over the first sacrificial layer;
a lithographic step to pattern the resist coated on wafer;
etching the hard-mask layer and using it as a hard mask for the following etching;
etching the first sacrificial layer and stripping the hard-mask residue;
deposition of a CVD layer over the sacrificial features;
etching the CVD layer to form spacers on the sidewall of sacrificial features;
using oxygen plasma process to strip amorphous carbon;
coating a thin film, then BARC and resist on the wafer;
a lithographic step to pattern the assisting features on resist;
etching the thin film to form assisting pads on top of oxide spacers;
depositing a second sacrificial layer;
etching the second sacrificial layer to form sacrificial spacers;
depositing a structural layer;
(optionally) etching the structural layer to form structural spacers;
coating BARC and resist on the wafer and using a cut mask in a lithographic step to pattern the resist;
etching to cut the ends of oxide and structural spacers to isolate the lines from each other;
etching the sacrificial spacers and the assisting pads with dry plasma process or wet solution, leaving sextuple the original density of the first sacrificial features;
a lithographic step to pattern the final pads on resist (attached to the end of lines for contact landing);
etching to transfer the final pattern to the substrate.

2. The method of claim 1 wherein the first sacrificial material is amorphous carbon.

3. The method of claim 1 wherein the first sacrificial material comprises a stack of resist and BARC.

4. The method of claim 1 wherein the CVD material deposited over the first sacrificial features is silicon oxide.

5. The method of claim 1 wherein the CVD material deposited over the first sacrificial features is silicon nitride.

6. The method of claim 1 wherein the first sacrificial feature is patterned resist and the CVD material deposited over the first sacrificial features is low-temperature (lower than 250° C.) silicon oxide (to avoid the thermal/chemical reaction between resist and CVD material).

7. The method of claim 6 wherein low-temperature oxide spacer pattern is transferred to amorphous carbon underneath.

8. The method of claim 4 wherein the two spacers formed on the sidewall of silicon oxide is polycrystalline (or amorphous) silicon and silicon oxide, respectively.

9. The method of claim 5 wherein the two spacers formed on the sidewall of silicon nitride is polycrystalline (or amorphous) silicon and silicon nitride, respectively.

10. The method of claim 7 wherein the two spacers formed on the sidewall of amorphous carbon is polycrystalline (or amorphous) silicon and silicon oxide, respectively.

11. The method of claim 7 wherein the two spacers formed on the sidewall of amorphous carbon is polycrystalline (or amorphous) silicon and silicon nitride, respectively.

* * * * *